(12) United States Patent
Kim

(10) Patent No.: US 7,733,148 B2
(45) Date of Patent: Jun. 8, 2010

(54) TEMPERATURE INDEPENDENT DELAY CIRCUITS

(75) Inventor: Hyung-seuk Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 12/249,237

(22) Filed: Oct. 10, 2008

(65) Prior Publication Data

US 2009/0102533 A1  Apr. 23, 2009

(30) Foreign Application Priority Data

Oct. 22, 2007  (KR)  ........................ 10-2007-0106209

(51) Int. Cl.
*H03H 11/26*  (2006.01)
(52) U.S. Cl. .................... 327/262; 327/270; 327/283; 327/290; 327/513
(58) Field of Classification Search .................... None
See application file for complete search history.

(56) References Cited

U.S. PATENT DOCUMENTS 5,864,258 A * 1/1999 Cusinato et al. ............ 331/34
6,842,078 B2 * 1/2005 Manna et al. ............... 331/57
7,061,334 B1   6/2006 Baig et al.
7,605,668 B2 * 10/2009 Fayneh et al. ............ 331/36 C

FOREIGN PATENT DOCUMENTS

| JP | 2005-102007 | 4/2005 |
|---|---|---|
| JP | 2006-165512 | 6/2006 |
| KR | 1999-0069093 | 9/1999 |

* cited by examiner

*Primary Examiner*—An T Luu
(74) *Attorney, Agent, or Firm*—Myers Bigel Sibley & Sajovec

(57) ABSTRACT

Delay circuits are provided. Some embodiments of delay circuits herein include a delay line including multiple delay cells connected in series and a variable voltage supplier operative to output a voltage value proportional and/or inversely proportional to a temperature. Delay circuits may include at least one loading capacitor that includes a first end that is connected to an output port of the delay cell and a second end that is connected to an output port of the variable voltage supplier, the at least one loading capacitor including a capacitance that is decreased corresponding to an increase in temperature when a positive voltage is applied across the first end and the second end of the at least one loading capacitor.

17 Claims, 8 Drawing Sheets

TEMPERATURE INDEPENDENT DELAY CIRCUITS

CROSS-REFERENCE TO RELATED PATENT APPLICATION

This application claims the priority of Korean Patent Application No. 10-2007-0106209, filed on Oct. 22, 2007, in the Korean Intellectual Property Office, the disclosure of which is incorporated herein in its entirety by reference.

BACKGROUND OF THE INVENTION

The present invention relates to electrical circuits, and more particularly, to a integrated electrical circuits.

In some integrated circuits (ICs), complicated circuit components operating with various signals and information may be integrated. An IC may use one or more clock signals to control complicated operations of the circuit components and adjust operating timings thereof. In applications of communication, signal processing, and the like, the IC may use signal sources and signal source generators as well as the clock signals. Circuit designers may benefit from a clock generation circuit and a signal source circuit that can be adapted to various circuits, processes, user applications, and/or variables such voltage and temperature, among others. A clock signal or reference signal can be generated by using various circuits including inverters and ring oscillators.

Reference is now made to FIG. 1, which is a graph illustrating an inversely-proportional-to-absolute-temperature (IPTAT) characteristic. As illustrated, the IPTAT characteristic may denote that a value is changed inversely proportional to a temperature. Referring to graph 101, a frequency may change inversely proportional to a change in temperature.

Reference is now made to FIG. 2, which is a graph illustrating a proportional-to-absolute-temperature (PTAT) characteristic. The PTAT characteristic may denote that a value is changed proportional to a temperature. Referring to graph 105, a frequency may change proportional to a temperature.

Reference is now made to FIG. 3, which is a circuit diagram illustrating a general ring oscillator 200. The ring oscillator 200 may include an odd number of inverters 221, 222, and 225. A general ring oscillator 200 may have a disadvantage in terms of generating a clock signal. For example, a delay time of each inverter may be increased according to an increase in temperature. The increase in delay time may lead to an increase in clock signal generating period T. Therefore, as the delay time is increased, the operating frequency of the ring oscillator may be disadvantageously lowered. Accordingly, the operating frequency characteristic of the ring oscillator 200 may be expressed by the aforementioned IPTAT characteristic shown in FIG. 1.

Inverters and/or a ring oscillator may have a large dependency on a temperature. Therefore, if the increase in delayed amount is not compensated according to an increase in temperature, the ring oscillator may not be normally operated.

In order to compensate for a change in characteristics of the ling oscillator according to a temperature, a method of increasing bias voltages of MOS transistors of the inverters has been proposed. More specifically, the increase in delayed amount according to a temperature may be prevented by applying increased bias voltages to the MOS transistors of the inverters. However, the method of increasing bias voltages may include limitations corresponding to low voltage operation and/or a high-speed operation.

A biased ring oscillator may allow only low voltage input and output. That is, high voltage signals may not be input to or output from the biased ring oscillator. In addition, since the biased ring oscillator may not be operated in a high frequency band, an operating period thereof may be increased. In this regard, a high speed operation may not be obtained. As an example, in a 70 nm DRAM, if a bias voltage of 1.35V is applied, a maximum operating frequency may be 1 MHz. That is, the DRAM may be inoperable at a frequency higher than 1 MHz.

SUMMARY OF THE INVENTION

Some embodiments of the present invention are directed to delay circuits. Embodiments of such delay circuits may include a delay line including multiple delay cells connected in series and a variable voltage supplier operative to output a voltage value proportional and/or inversely proportional to a temperature. Some embodiments include at least one loading capacitor that includes a first end that is connected to an output port of the delay cell and a second end that is connected to an output port of the variable voltage supplier, the at least one loading capacitor including a capacitance that is decreased corresponding to an increase in temperature when a positive voltage is applied across the first end and the second end of the at least one loading capacitor.

In some embodiments, the variable voltage supplier is configured to supply a voltage that is higher than a low power source voltage and lower than a high power source voltage when the delay cell outputs the low power source voltage as a logic low signal and the high power source voltage as a logic high signal. Some embodiments provide that the quantity of the delay cells in the delay line includes an odd number n and each of the delay cells includes a stage of the delay line. In some embodiments, an input port of a first delay cell in a first stage of the delay line is connected to an output port of an n-th delay cell in a last stage of the delay line.

Some embodiments provide that the variable voltage supplier is configured to output a voltage value that is inversely proportional to the temperature, and the first end of the loading capacitor includes a body port and the second end of the loading capacitor comprises a gate port. In some embodiments, the capacitance of the loading capacitor is increased and/or decreased proportional to the voltage applied across the first end and the second end of the loading capacitor when the voltage applied across the first end and the second end of the loading capacitor is larger than 0V. In some embodiments, the loading capacitor includes an accumulation MOS capacitor having highly-doped N-type impurity regions in an N-well.

In some embodiments, the variable voltage supplier is configured to output a voltage value that is proportional to the temperature and the first end of the loading capacitor includes a body port and the second end of the loading capacitor includes a gate port. Some embodiments provide that the capacitance of the loading capacitor is increased and/or decreased proportional to the voltage across the first end and the second end of the loading capacitor when the voltage applied across the first end and the second end of the loading capacitor is larger than 0V. In some embodiments, the loading capacitor includes an accumulation MOS capacitor including highly-doped N-type impurity regions in an N-well.

In some embodiments, wherein the variable voltage supplier is configured to output a voltage value inversely proportional to the temperature and the first end of the loading capacitor includes a body port and the second end of the loading capacitor includes a gate port. Some embodiments provide that the capacitance of the loading capacitor is increased and/or decreased proportional to the voltage applied across the first end and the second end of the loading capacitor when the voltage applied across the first end and the second end of the loading capacitor is larger than 0V. In some embodiments, the loading capacitor includes an accumulation MOS capacitor having highly-doped N-type impurity regions in an N-well.

In some embodiments, the variable voltage supplier outputs a voltage value proportional to the temperature and the first end of the loading capacitor includes a body port and the second end of the loading capacitor includes a gate port. Some embodiments provide that the capacitance of the loading capacitor is increased and/or decreased proportional to the voltage applied across the first end and the second end of the loading capacitor when the voltage applied across the first end and the second end of the loading capacitor is larger than 0V. In some embodiments, the loading capacitor includes an accumulation MOS capacitor having highly-doped N-type impurity regions in an N-well.

In some embodiments, the delay cell includes an inverter. In some embodiments, the delay cell includes a NAND gate, a NOR gate, and/or an XNOR gate.

DETAILED DESCRIPTION OF THE INVENTION

Figure 1:
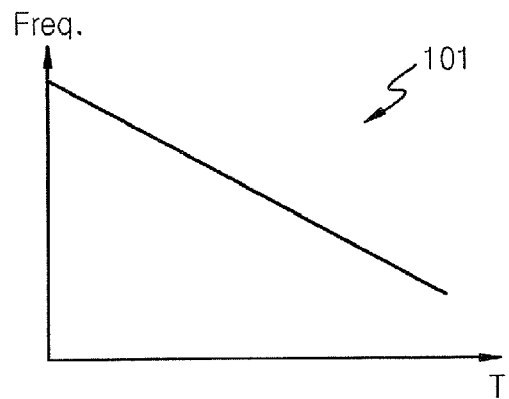
FIG. 1 is a graph illustrating an inversely-proportional-to-absolute-temperature (IPTAT) characteristic.
Figure 2:
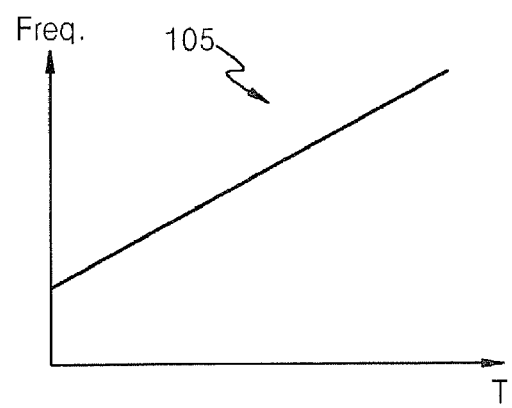
FIG. 2 is a graph illustrating a proportional-to-absolute-temperature (PTAT) characteristic.
Figure 3:
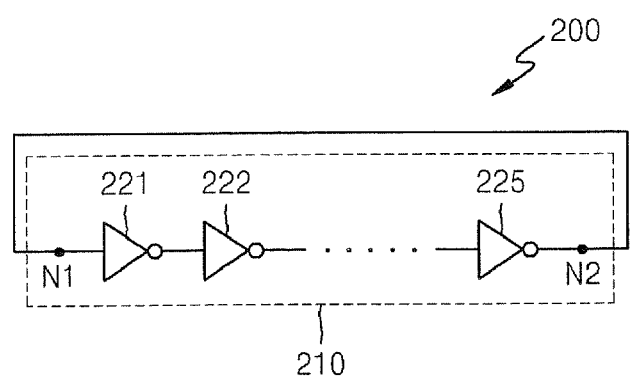
FIG. 3 is a circuit diagram illustrating a general ring oscillator.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
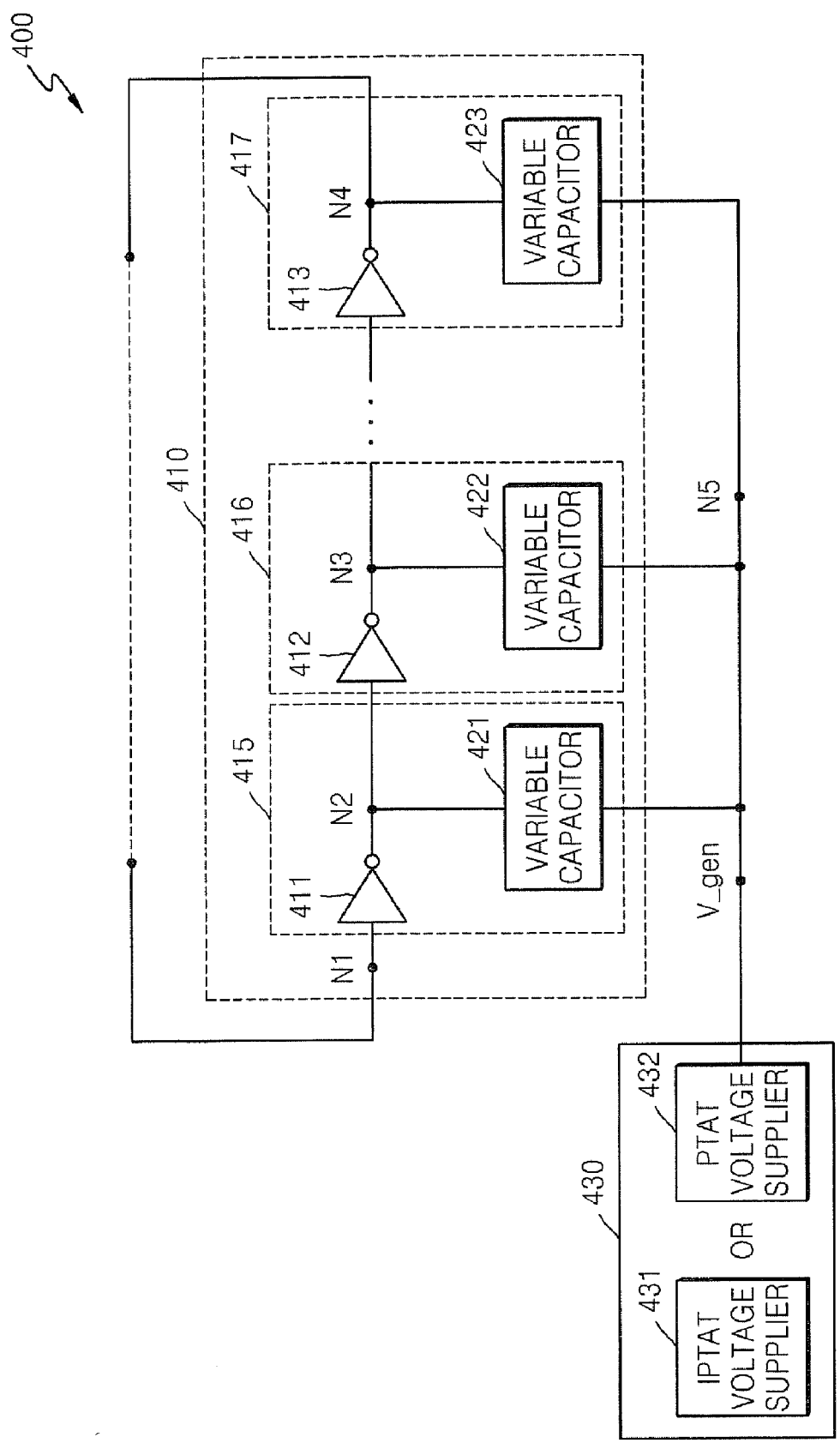
FIG. 4A is a block diagram illustrating a delay circuit according to some embodiments of the present invention.

Reference is now made to FIG. 4A, which is a block diagram illustrating a delay circuit 400 according to some embodiments of the present invention. In some embodiments, the delay circuit 400 may include a delay line 410 and a variable voltage supplier 430. Some embodiments provide that the delay line 410 includes multiple delay cells 415, 416, and 417.

In some embodiments, the delay line 410 may function as a delay line by delaying and outputting an input signal with a predetermined delay time when an input port, that is, a first node N1 of the delay line 410 is not connected to an output port, that is, a fourth node N4 thereof. Some embodiments provide that the delay line 410 may function as a ring oscillator by outputting an oscillating signal when the input port, that is, the first node N1 of the delay line 410 is connected to the output port, that is, the fourth node N4 thereof in a feedback loop.

In some embodiments, the delay line 410 delays the input signal applied to the first node N1 by using the multiple delay cells. For example, the delay line 410 may output a delayed signal with a predetermined delay amount. Some embodiments provide that the delayed amount may be varied according to device characteristics of the delay cells and user's design.

Some embodiments according to FIG. 4A provide a case where inverters may be used for the delay cells. In some embodiments, NAND gates, NOR gates, and/or XNOR gates may be used for the delay cells instead of the inverters.

The NAND gates, the NOR gates, and/or the XNOR gates may have two input ports. Some embodiments provide that the two input ports may be input with a single input signal. For example, in an inversion operation of the NAND gate, when an input signal 0 is applied to the NAND gate, the input signal 0, that is, an input value (0, 0) may be input to the two input ports of the NAND gate. The NAND gate may perform a logical AND operation on the input values (0, 0) and output an inversion value, that is, 1. In this regard, the NAND gates, the NOR gates, and/or the XNOR gates may be used as an inversion delay devices.

In some embodiments, the variable voltage supplier 430 supplies a PTAT voltage or an IPTAT voltage. Some embodiments provide that an arrangement of the variable capacitors 421, 422, and 423 may determine which one of the PTAT voltage and the IPTAT voltage is supplied.

In some embodiments, the variable voltage supplier 430 outputs a voltage V_gen which may be in a range from a low power source voltage Vss to a high power source voltage Vdd. Accordingly, some embodiments provide that the voltage V_gen satisfies Vss<V_gen<Vdd. In some embodiments, the low and high power source voltages are operating voltages of each inverter. Some embodiments provide that each inverter outputs the low power source voltage and the high power source voltage as a logic low signal and a logic high signal, respectively. In some embodiments, a ground voltage may be used as the low power source voltage. As discussed below, some embodiments provide that the ground voltage Vground (0V) is used as the low power source voltage.

Referring to FIG. 4A, each delay cell (for example, 415) may include a loading capacitor (for example, 421) connected to an internal output port (for example, a second node N2). In some embodiments, the loading capacitor may be a capacitor connected to an internal output port of a delay cell to provide an output voltage of the delay cell. Accordingly, some embodiments provide that the loading capacitor 421 may be included inside the delay cell, that is, the inverter 411. In some embodiments, the loading capacitor 421 may be connected to the output port of the inverter 411 as illustrated in FIG. 4A.

In some embodiments, the loading capacitor 421 compensates for an increase in delay amount according to an increase in temperature. Some embodiments provide that an increase in temperature may be in response to a voltage across both ends of the loading capacitor 421. Manufacture and operation of the loading capacitor 421 according to some embodiments will be described in detail with reference to FIGS. 4B and 4C.

Figure 4B:
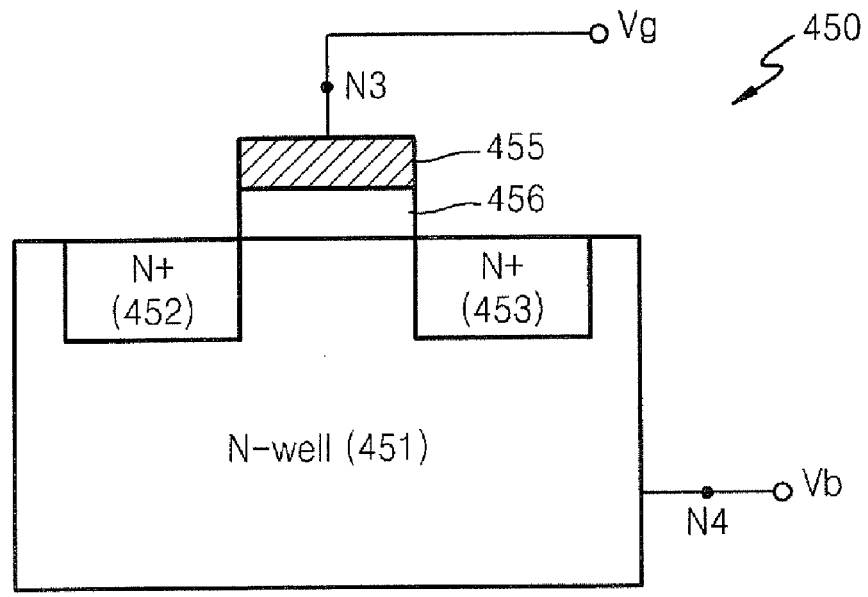
FIG. 4B is a cross-sectional view illustrating a loading capacitor of the delay circuit of FIG. 4A.

Reference is now made to FIG. 4B, which is a cross-sectional view illustrating the loading capacitor of the delay circuit of FIG. 4A. Some embodiments provide that the loading capacitor 421 included in the delay cell 415 according to the present invention includes an N-well 451 and highly-doped N-type impurity regions 452 and 453. In some embodiments, one end of the loading capacitor 421 is a port Vb (hereinafter, referred to as a body port of a capacitor) that may be formed on the N-well 451. Some embodiments provide that the other end of the loading capacitor 421 is a port Vg (hereinafter, referred to as a gate port of a capacitor) that is formed on a gate 455. In some embodiments, gate 455 is formed on the N-well 451 between the high-doped N-type regions 452 and 453. More specifically, some embodiments provide that a gate oxide 456 is formed to be interposed between the gate 455 and the N-well 451. In this manner, the voltage across the loading capacitor becomes a voltage Vgb.

Figure 5A:
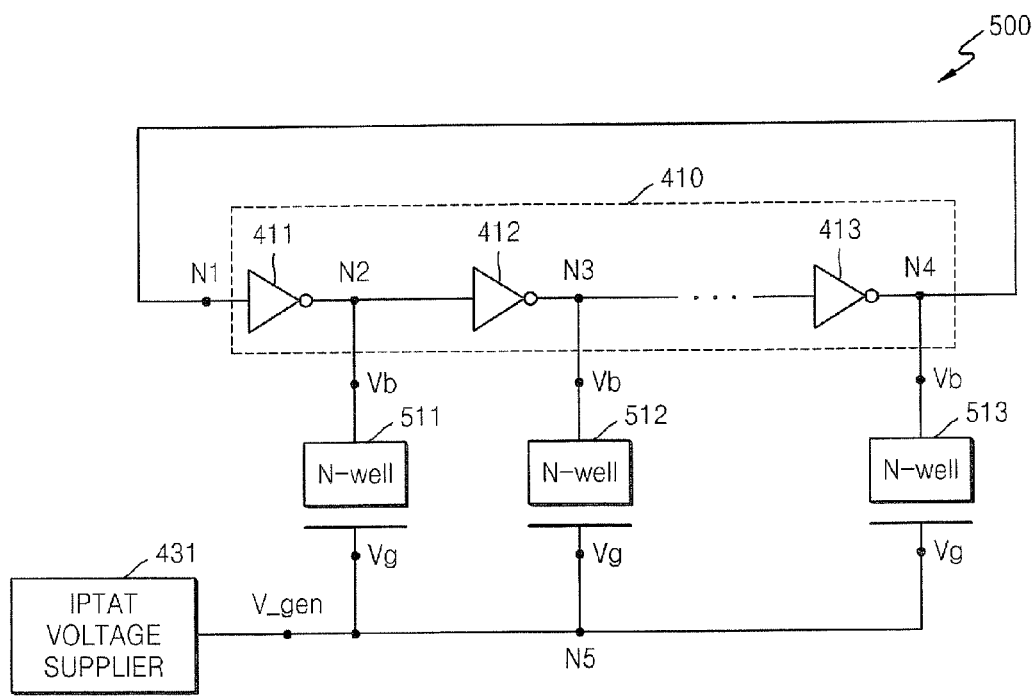
FIG. 5A is a detailed schematic diagram illustrating a modified example of the delay circuit of FIG. 4A according to some embodiments of the present invention.
Figure 6A:
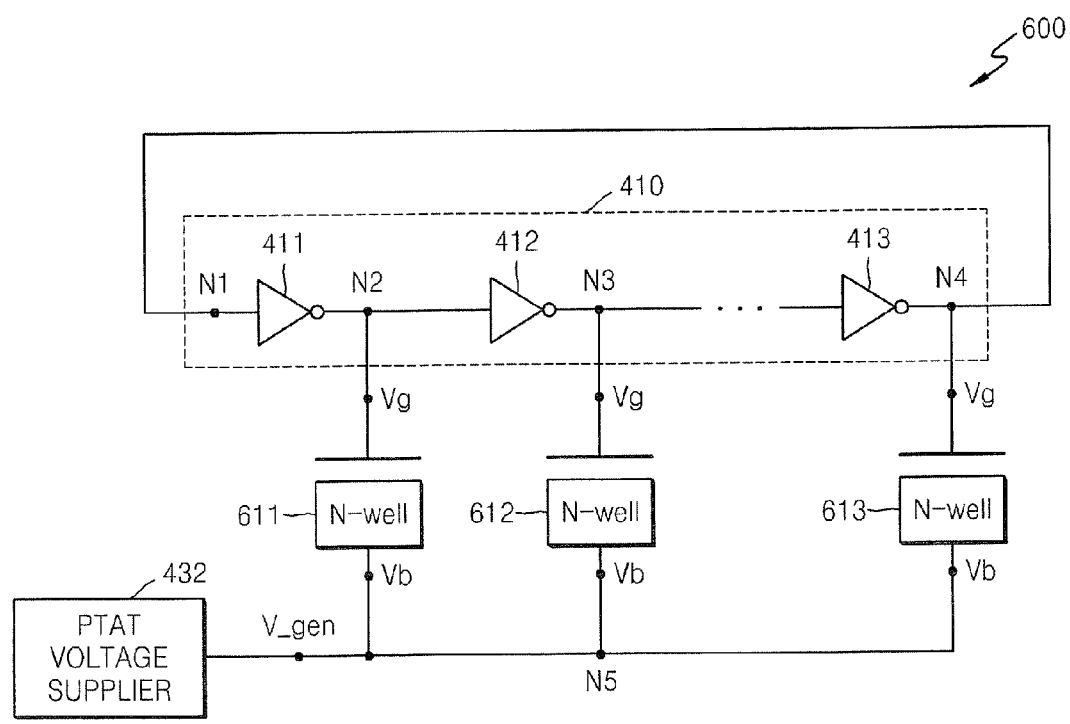
FIG. 6A is a detailed schematic diagram illustrating a modified example of the delay circuit of FIG. 4A according to some embodiments of the present invention.

The loading capacitor formed by doping the N-well with a high concentration of N-type impurities as shown in FIG. 4B may be called an accumulation MOS capacitor. In the delay circuit 400 according to some embodiments of the present invention, the accumulation MOS capacitor ma be used as the internal loading capacitor. In FIGS. 5A and 6A described later, all the capacitors may be accumulation MOS capacitors, as illustrated in FIG. 4A. In some embodiments, capacitors as shown in FIG. 4B may be called variable capacitors.

Figure 4C:
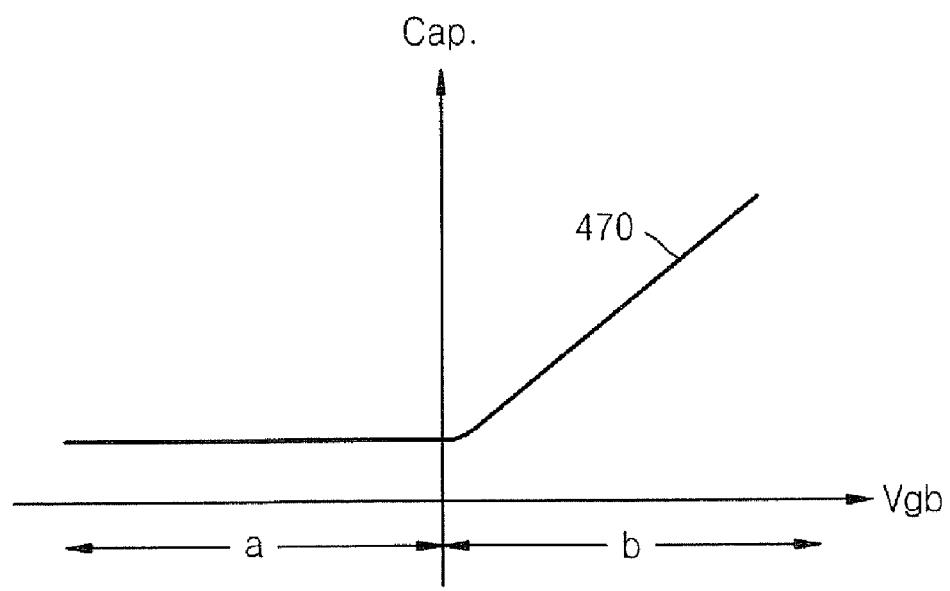
FIG. 4C is a graph illustrating a voltage-capacitance characteristic curve of the loading capacitor of FIG. 4B.

Reference is now made to FIG. 4C, which is a graph illustrating a voltage-capacitance characteristic curve of the loading capacitor of FIG. 4B. A capacitance Cap of the capacitor shown in FIG. 4A may have different characteristics according to the voltage Vgb between the gate 455 and the N-well 451. In a region 'a' where the voltage Vgb may be equal to or less than 0V, the capacitance Cap may have a constant value irrespective of a change in voltage Vgb. In a region 'b' where the voltage Vgb may be more than 0V, the capacitance Cap may be increased proportional to the voltage Vgb.

Reference is made to FIG. 5A, which is a detailed schematic diagram illustrating a delay circuit 500 as a modified example of the delay circuit of FIG. 4A. The delay circuit 500 may include an IPTAT voltage supplier 431 as a variable voltage supplier. In some embodiments, output points N2, N3, and N4 of inverters 411, 412, and 413 may be connected to body points Vb of variable capacitors. Some embodiments provide that gate ports Vg of the variable capacitors may be connected to the IPTAT voltage supplier 431.

In some embodiments, the IPTAT voltage supplier 431 may output a voltage V_gen which may be inversely proportional to a temperature. Some embodiments provide that the voltage output from the IPTAT voltage supplier 431 may be in a range of the ground voltage Vground to the high power source voltage Vdd. That is, the voltage V_gen may satisfy 0<V_gen<Vdd.

In some embodiments, the construction of each of delay cells 415, 416, and 417 of the delay circuit 500 of FIG. 5A may be the same as that of FIG. 4A. In this regard, duplicative description thereof is omitted.

Figure 5B:
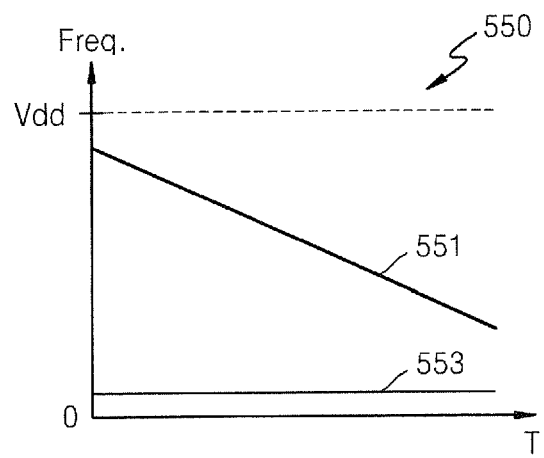
FIG. 5B illustrates graphs for explaining operations of the delay circuit of FIG. 5A according to some embodiments of the present invention.
Figure 5B:
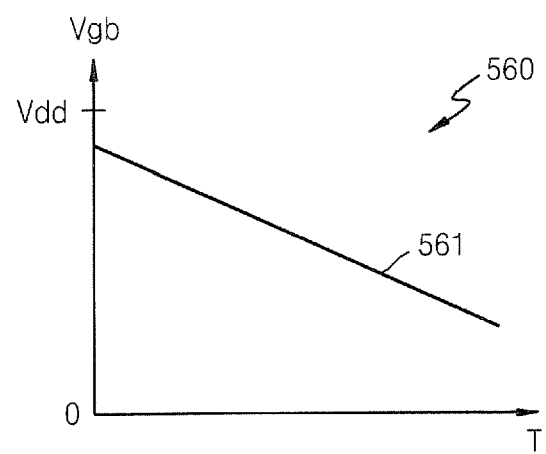
Figure 5B:
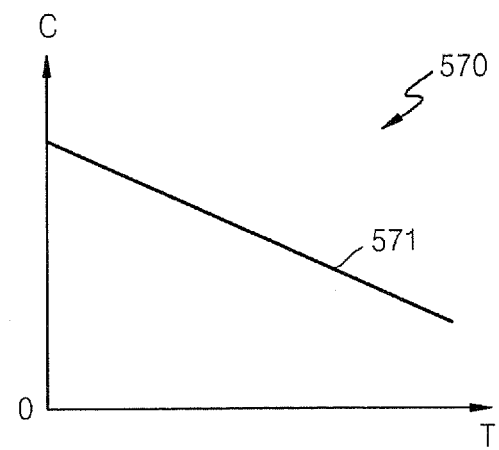

Reference is now made to FIG. 5B, which illustrates graphs for explaining operations of the delay circuit 500 of FIG. 5A according to some embodiments of the present invention. In some embodiments, a graph 550 shows the output voltage V_gen 551 of the IPTAT voltage supplier and the logic low signal 553 of the inverter (for example, 411). Some embodiments provide that the logic high signal of the inverter 411 becomes the voltage Vdd.

In some embodiments, graph 560 shows a change in voltage Vgb across the variable capacitor (for example, 511) according to a temperature. Some embodiments provide that graph 570 shows a change in capacitance Cap of the variable capacitor according to a temperature.

In some embodiments, the IPTAT voltage supplier 431 of the delay circuit 500 of FIG. 5A may output to the gate port Vg of the variable capacitor 511 the voltage V_gen that is decreased according to an increase in temperature. The voltage V_gen may be illustrated by the graph 551.

If the output signal of the inverter 411 has the logic high voltage Vdd, the voltage Vgb across the variable capacitor 511 may have a negative value. This is because Vgb=Vg−Vb and the voltage Vb is smaller than the voltage Vg. As the variable capacitor 511 may have a characteristic graph shown in FIG. 4C, the variable capacitor 511 may have a constant capacitance.

If the output signal of the inverter 411 has the logic low voltage (0V), the voltage Vgb may have a positive value. The voltage Vgb across the variable capacitor 511 may be illustrated by graph 561.

In some embodiments, the capacitance of the variable capacitor 511 is proportional to the voltage Vgb between the variable capacitor 511. In this regard, as shown in the graph 571, the capacitance Cap of the variable capacitor 511 may decrease responsive to an increase in temperature.

Accordingly, the capacitance of the loading capacitor of the delay cell may decrease according to an increase in temperature. The delayed amount may be defined by an equation, T=RC, where R is an intrinsic resistance of the inverter and C is a capacitance of the inverter. Some embodiments provide that since the capacitance of the loading capacitor may be decreased, the delayed amount may be increased according to an increase in temperature. As a result, an increase in delayed amount according to the increase in temperature may be prevented.

Further, the delay circuit 500 according to some embodiments of the present invention may not be affected by operating voltage ranges of input and output voltages. In this regard, the delay circuit 500 may be operated in a high voltage range.

FIG. 6A is a schematic diagram illustrating a delay circuit 600 according to some embodiments of the present invention. Some embodiments provide that the delay circuit 600 includes a PTAT voltage supplier 432 as a variable voltage supplier. Output ports N2, N3, and N4 of inverters 411, 412, and 413 may be connected to gate ports Vg of variable capacitors, and body ports Vb of the variable capacitors may be connected to the PTAT voltage supplier 432.

In some embodiments, the PTAT voltage supplier 432 outputs a voltage V_gen which may be proportional to a temperature. The voltage output from the PTAT voltage supplier 432 may range in voltage from the ground voltage Vground to the high power source voltage Vdd. That is, the voltage V_gen may satisfies 0<V_gen<Vdd. The other constructions of the delay circuit 600 are the same as those of the delay circuits of FIGS. 4A and 5A. Therefore, detailed description thereof is omitted.

Figure 6B:
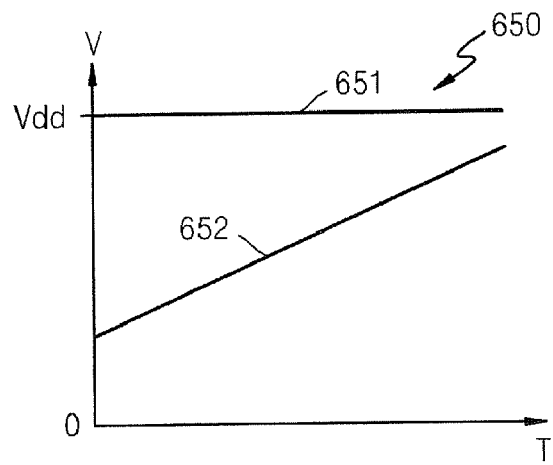
FIG. 6B illustrates graphs for explaining operations of the delay circuit of FIG. 6A according to some embodiments of the present invention.
Figure 6B:
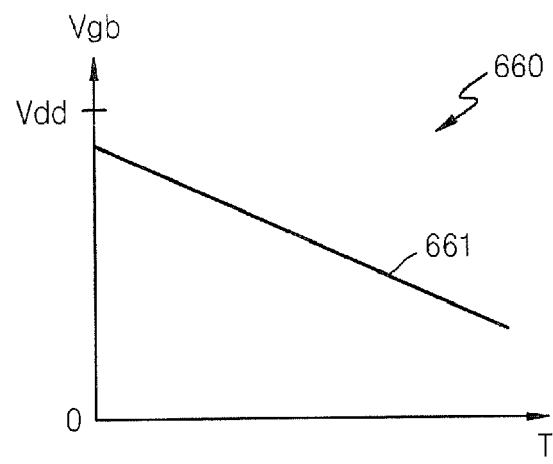
Figure 6B:
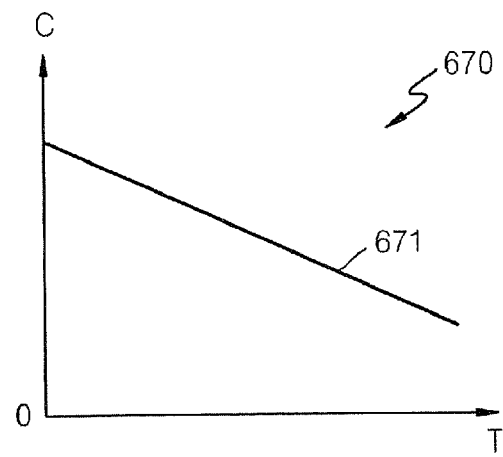

Reference is made to FIG. 6B, which illustrates graphs for explaining operations of the delay circuit of FIG. 6A according to some embodiments of the present invention. Some embodiments provide that a graph 650 shows the output voltage V_gen 652 of the PTAT voltage supplier 432 and the logic high signal 651 of the inverter (for example, 411). In some embodiments, the logic high signal of the inverter 411 becomes the ground voltage Vground (0V).

A graph 660 shows a change in voltage Vgb across the variable capacitor (for example, 611) according to temperature. A graph 670 shows a change in capacitance Cap of the variable capacitor 611 according to a temperature.

In some embodiments, the PTAT voltage supplier 432 of the delay circuit 600 of FIG. 6A outputs the voltage V_gen that is increased according to an increase in temperature to the body port Vb of the variable capacitor 611. The voltage V_gen is illustrated by the graph 652.

If the output signal of the inverter 411 has the logic low voltage (0V), the voltage Vgb across the variable capacitor 611 may have a negative value. In this regard, the variable capacitor 611 may have a constant capacitance.

If the output signal of the inverter 41 has the logic high voltage Vdd, the voltage Vgb (=Vg−Vb) may have a positive value. The voltage Vgb across the variable capacitor 611 is illustrated by the graph 661.

The capacitance of the variable capacitor 611 may be proportional to the voltage Vgb across the variable capacitor 611. As shown in the graph 671, the capacitance Cap of the variable capacitor 611 may decrease responsive to an increase in temperature.

Similar to the delay circuit 500 of FIG. 5A, in the delay circuit 600 of FIG. 6A, the capacitance of the loading capacitor (variable capacitor) may decrease responsive to an increase in temperature. Since the capacitance of the loading capacitor may be decreased, the delayed amount may not increase even in case of an increase in temperature. As a result, an additional increase in delayed amount responsive to an increase in temperature may be prevented.

Figure 7:
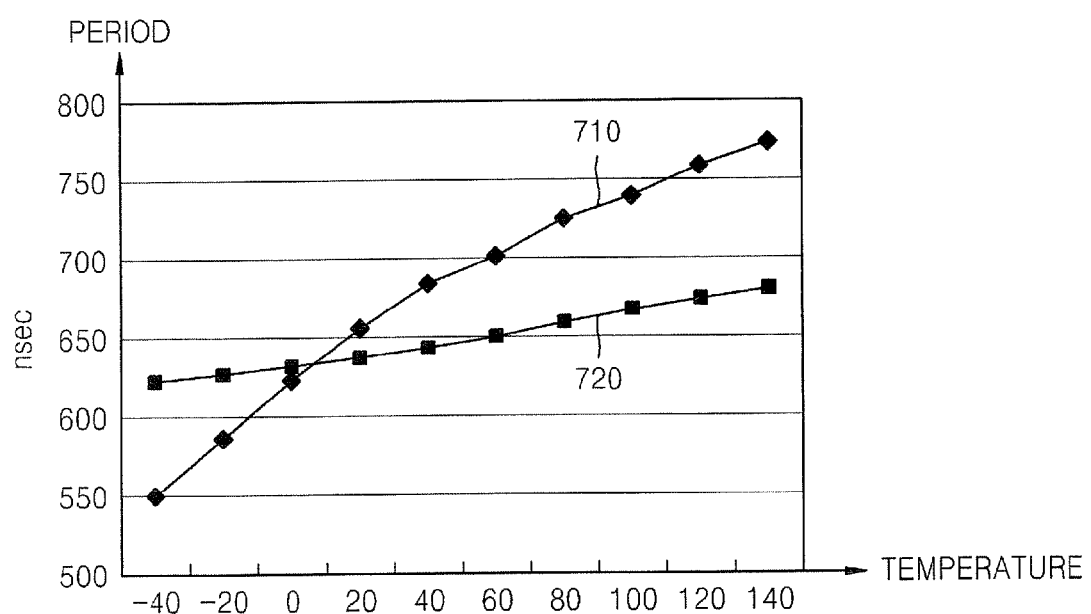
FIG. 7 is a graph illustrating effects according to some embodiments of the present invention.

Reference is now made to FIG. 7, which is a graph illustrating effects according to some embodiments of the present invention. The graph of FIG. 7 illustrates a change in operating period of a delay cell as a function of temperature. In this regard, the X axis shows the temperature in units of Celsius and the Y axis shows the operating period of the delay cell in nanoseconds (nsec).

A graph 710 shows a change in operating period of a conventional ring oscillator. A graph 720 shows a change in operating period of the delay circuit 400 according to some embodiments of the present invention.

Referring to the graph 710, the operating period of the conventional ring oscillator increases substantially responsive to an increase in temperature. In comparison, the operating period of the delay circuit 400 according some embodiments of the present invention increases only slightly responsive to an increase in temperature. Stated differently, the delay circuit 400 according to some embodiments of the present invention may be less affected by a change in temperature compared to a conventional ring oscillator. In this regard, the delay circuit 400 may efficiently compensate for a temperature change related delay.

In a delay circuit according to some embodiments of the present invention, it is possible to prevent and/or reduce an increase in the delay amount of a delay circuit that may result from an increase in temperature. The prevention and/or reduction in delay may be achieved by using a capacitor having a capacitance that decreases responsive to the increase in temperature.

In some embodiments, the delay circuit may not be affected by an operating voltage range. Accordingly, some embodiments provide that the delay circuit may be operated in a high voltage range.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay circuit comprising:
   a delay line including a plurality of delay cells connected in series;
   a variable voltage supplier operative to output a voltage value proportional and/or inversely proportional to a temperature; and
   at least one loading capacitor that includes a first end that is connected to an output port of the delay cell and a second end that is connected to an output port of the variable voltage supplier, the at least one loading capacitor including a capacitance that is decreased corresponding to an increase in temperature when a positive voltage is applied across the first end and the second end of the at least one loading capacitor.

2. The delay circuit of claim 1, wherein the variable voltage supplier is configured to supply a voltage that is higher than a low power source voltage and lower than a high power source voltage when the delay cell outputs the low power source voltage as a logic low signal and the high power source voltage as a logic high signal.

3. The delay circuit of claim 2,
wherein the quantity of the plurality of delay cells in the delay line comprises an odd number n,
wherein each of the plurality of delay cells comprises a stage of the delay line, and
wherein an input port of a first delay cell in a first stage of the delay line is connected to an output port of an n-th delay cell in a last stage of the delay line.

4. The delay circuit of claim 3,
wherein the variable voltage supplier is configured to output a voltage value that is inversely proportional to the temperature, and
wherein the first end of the loading capacitor comprises a body port and the second end of the loading capacitor comprises a gate port.

5. The delay circuit of claim 4, wherein the capacitance of the loading capacitor is increased and/or decreased proportional to the voltage applied across the first end and the second end of the loading capacitor when the voltage applied across the first end and the second end of the loading capacitor is larger than 0V.

6. The delay circuit of claim 5, wherein the loading capacitor comprises an accumulation MOS capacitor including highly-doped N-type impurity regions in an N-well.

7. The delay circuit of claim 3,
wherein the variable voltage supplier is configured to output a voltage value that is proportional to the temperature, and
wherein the first end of the loading capacitor comprises a body port and the second end of the loading capacitor comprises a gate port.

8. The delay circuit of claim 7, wherein the capacitance of the loading capacitor is increased and/or decreased proportional to the voltage across the first end and the second end of the loading capacitor when the voltage applied across the first end and the second end of the loading capacitor is larger than 0V.

9. The delay circuit of claim 8, wherein the loading capacitor comprises an accumulation MOS capacitor including highly-doped N-type impurity regions in an N-well.

10. The delay circuit of claim 2,
wherein the variable voltage supplier is configured to output a voltage value inversely proportional to the temperature, and
wherein the first end of the loading capacitor comprises a body port and the second end of the loading capacitor comprises a gate port.

11. The delay circuit of claim 10, wherein the capacitance of the loading capacitor is increased and/or decreased proportional to the voltage applied across the first end and the second end of the loading capacitor when the voltage applied across the first end and the second end of the loading capacitor is larger than 0V.

12. The delay circuit of claim 11, wherein the loading capacitor comprises an accumulation MOS capacitor having highly-doped N-type impurity regions in an N-well.

13. The delay circuit of claim 2,
wherein the variable voltage supplier outputs a voltage value proportional to the temperature, and
wherein the first end of the loading capacitor comprises a body port and the second end of the loading capacitor comprises a gate port.

14. The delay circuit of claim 13, wherein the capacitance of the loading capacitor is increased and/or decreased proportional to the voltage applied across the first end and the second end of the loading capacitor when the voltage applied across the first end and the second end of the loading capacitor is larger than 0V.

15. The delay circuit of claim 14, wherein the loading capacitor comprises an accumulation MOS capacitor including highly-doped N-type impurity regions in an N-well.

16. The delay circuit of claim 1, wherein the delay cell comprises an inverter.

17. The delay circuit of claim 1, wherein the delay cell comprises a NAND gate, a NOR gate, and/or an XNOR gate.

* * * * *